United States Patent
Lelental et al.

(10) Patent No.: US 6,168,911 B1
(45) Date of Patent: *Jan. 2, 2001

(54) FORMULATIONS FOR PREPARING METAL OXIDE-BASED PIGMENT-BINDER TRANSPARENT ELECTRICALLY CONDUCTIVE LAYERS

(75) Inventors: Mark Lelental; John M. Noonan; Ralph H. Young, all of Rochester, NY (US)

(73) Assignee: Eastman Kodak Company, Rochester, NY (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/216,369

(22) Filed: Dec. 18, 1998

(51) Int. Cl.⁷ ........................................ G03C 1/89
(52) U.S. Cl. .................. 430/529; 430/527; 430/530; 430/533
(58) Field of Search ...................... 430/527, 529, 430/530, 533

(56) References Cited

U.S. PATENT DOCUMENTS

| | | |
|---|---|---|
| 4,344,441 | 8/1982 | Radke . |
| 4,394,441 | 7/1983 | Kawaguchi et al. ............ 430/527 |
| 4,416,963 | 11/1983 | Takimoto et al. .............. 430/527 |
| 4,418,141 | 11/1983 | Kawaguchi et al. ............ 430/527 |
| 4,442,168 | 4/1984 | White et al. . |
| 4,495,276 | 1/1985 | Takimoto et al. .............. 430/527 |
| 4,571,361 | 2/1986 | Kawaguchi et al. . |
| 4,999,276 | 3/1991 | Kuwabara et al. ............. 430/527 |
| 5,204,219 | 4/1993 | Van Ooij et al. .............. 430/531 |
| 5,236,818 | 8/1993 | Carlson ...................... 430/527 |
| 5,360,706 * | 11/1994 | Anderson et al. .............. 430/530 |
| 5,484,694 * | 1/1996 | Lelental et al. ............... 430/530 |
| 5,547,821 * | 8/1996 | Melpolder et al. ............. 430/530 |
| 5,719,016 * | 2/1998 | Christian et al. .............. 430/530 |
| 5,731,119 * | 3/1998 | Eichorst et al. ............... 430/530 |
| 5,866,287 * | 2/1999 | Christian et al. .............. 430/530 |
| 5,888,712 * | 3/1999 | Lelental et al. ............... 430/530 |
| 5,891,611 * | 4/1999 | Majumdar et al. ............. 430/529 |

FOREIGN PATENT DOCUMENTS

| | | |
|---|---|---|
| 250154 | 6/1987 | (EP) . |
| 301827 | 7/1988 | (EP) . |
| O 841 590 A1 | 5/1998 | (EP) . |
| O 841 591 A1 | 5/1998 | (EP) . |
| O 905 315 A1 | 3/1999 | (EP) . |
| O 675 401 A1 | 10/1999 | (EP) . |
| O 947 878 A2 | 10/1999 | (EP) . |

* cited by examiner

*Primary Examiner*—Richard L. Schilling
(74) *Attorney, Agent, or Firm*—Doreen M. Wells; Carl F. Ruoff

(57) ABSTRACT

The present invention is an imaging element which includes a support, an image-forming layer superposed on the support and an electrically-conductive layer superposed on the support. The electrically-conductive layer includes an electrically-conductive particle having an average particle size less than 0.1 micrometer and a binder, said binder comprising at least 25 weight percent of a polyesterionomer.

28 Claims, 3 Drawing Sheets

FORMULATIONS FOR PREPARING METAL OXIDE-BASED PIGMENT-BINDER TRANSPARENT ELECTRICALLY CONDUCTIVE LAYERS

FIELD OF THE INVENTION

This invention relates to imaging elements which include a support material, one or more image forming layers, and one or more electrically conductive layers. More specifically, this invention relates to improved electrically conductive layers containing colloidal electrically conductive particles and polymeric binders or blends of polymeric binders.

BACKGROUND OF THE INVENTION

Problems associated with the generation and discharge of electrostatic charge during the manufacture and use of photographic film and paper products have been recognized for many years by the photographic industry. The accumulation of static charge on film or paper surfaces can cause irregular fog patterns in the emulsion layer. The presence of static charge also can lead to the attraction of dust, which can result in repellency spots during coating, fog, densitization, and other physical defects. The discharge of accumulated charge during or after the application of the sensitized emulsion layer(s) also can produce irregular fog patterns or "static marks" in the emulsion layer. The severity of such static problems has been exacerbated greatly by increases in the sensitivity of new emulsions, increases in coating machine speeds, and increases in post-coating drying efficiency. The charge generated during the coating process results primarily from the tendency of webs of high resistivity polymeric film base to charge during winding and unwinding operations (unwinding static), during transport through the coating machines (transport static), and during finishing operations such as slitting and spooling. Static charge can also be generated during the use of the final photographic film product. In an automatic camera, the winding of roll film out of and back into the film cassette, especially in a low relative humidity environment, can result in static charging and marking. Similarly, high-speed automated film processing equipment can produce static charging resulting in marking.

It is widely known and accepted that electrostatic charge can be dissipated effectively by incorporating one or more electrically conductive "antistatic" layers into the overall film structure. Antistatic layers can be applied to one or to both sides of the film support as subbing layers either beneath or on the side opposite to the sensitized emulsion layer. Alternatively, an antistatic layer can be applied as the outermost-coated layer (overcoat) either over the emulsion layers (i.e., SOC) or on the side of the film support opposite to the emulsion layers (backcoat) or both. For some applications, the antistatic function can be included in the emulsion layers. Alternatively, the antistatic layer function can be incorporated into the bulk plastic film base by means of co-extrusion or co-casting techniques.

A wide variety of electrically conductive materials can be incorporated in antistatic layers to produce a broad range of surface conductivities. Many of the traditional antistatic layers used for photographic applications employ materials, which exhibit predominantly ionic conductivity. Antistatic layers containing simple inorganic salts, alkali metal salts of surfactants, ionic conductive polymers or polymeric electrolytes containing alkali metal salts and the like have been taught in the prior art. The electrical conductivities of such ionic conductors are typically strongly dependent on the temperature and relative humidity of the surrounding environment. At low relative humidities and temperatures, the diffusional mobilities of the charge carrying ions are greatly reduced and the bulk conductivity is substantially decreased. At high relative humidities, an exposed antistatic backcoating can absorb water, swell, and soften. Especially in the case of roll films, this can result in a loss of adhesion between layers and physical transfer of portions of the backcoating to the emulsion side of the film. Also, many of the inorganic salts, polymeric electrolytes, and low molecular weight surfactants -typically used in such antistatic layers are water soluble and can be leached out during film processing, resulting in a loss of antistatic function.

In addition to alkali metal salts, colloidal metal oxide sols have been found to exhibit ionic conductivity when incorporated in antistatic layers. Typically, alkali metal salts or anionic surfactants are used to stabilize such metal oxide sols. A thin antistatic layer consisting of a gelled network of colloidal metal oxide particles (e.g., silica, antimony pentoxide, alumina, titania, stannic oxide, zirconia, etc.) with an optional polymeric binder to promote adhesion to both the support and overlying emulsion layer(s) has been disclosed in EP 250,154. An optional ambifunctional silane or titanate coupling agent can be introduced to the gelled network to improve adhesion to the overlying emulsion layers (e.g., EP 301,827; U.S. Pat. No. 5,204,219). Further, an alkali metal orthosilicate can be included to minimize the loss of conductivity by the gelled network observed when said antistatic layer is overcoated with gelatin-containing layers (U.S. Pat. No. 5,236,818). In addition, coatings containing colloidal metal oxides (e.g., antimony pentoxide, alumina, tin oxide, indium oxide, etc.) and colloidal silica with an organopolysiloxane binder have been claimed to enhance abrasion resistance as well as provide antistatic function when used as an overcoat or backcoat (U.S. Pat. No. 4,442,168).

Antistatic layers incorporating electronic rather than ionic conductors also have been described. Because their electrical conductivity depends primarily on electronic mobilities rather than on ionic mobilities, the observed conductivity is independent of relative humidity and only slightly influenced by ambient temperature. Antistatic layers containing conjugated conductive polymers, conductive carbon particles, crystalline semiconductor particles, amorphous semiconductor fibrils, and continuous semiconductive thin films or networks are well known in the prior art.

Fine particles of crystalline conductive metal oxides dispersed with polymeric binders have been used to prepare optically transparent, humidity insensitive, antistatic layers for a wide variety of imaging applications. Many binary metal oxides doped with appropriate donor heteroatoms are known to be useful in antistatic layers for photographic and electrophotographic imaging elements (e.g., U.S. Pat. Nos. 4,416,963; 4,495,276; 4,394,441; 4,418,141; 4,571,361; 4,999,276). An exhaustive listing of previously claimed conductive metal oxides includes: zinc oxide, titania, tin oxide, alumina, indium oxide, indium and zinc antimonates, silica, magnesia, zirconia, barium oxide, molybdenum trioxide, tungsten trioxide, and vanadium pentoxide. The semiconductive metal oxide most widely used in conductive layers for imaging elements is a crystalline antimony-doped tin oxide with a most preferred antimony dopant level between 0.1 and 10 atom % Sb (for $Sb_xSn_{1-x}O_2$) as disclosed in U.S. Pat. No. 4,344,441.

The present invention provides an improved imaging element having antistatic layers containing colloidal conductive metal oxide containing particles and polyesterionomer binder or polyesterionomer-gelatin blend binder system. These layers exhibit superior conductivity and dynamic wettability at a given dry weight laydown and tin oxide to binder ratio when compared to those formulated using gelatin-only binder.

This invention permits the use of substantially lower tin oxide to binder ratios and lower dry weight coverages in the antistatic layer to achieve similar or lower surface resistivities than those disclosed in Prior Art and provides superior dynamic wettability characteristics of the photographic supports subbed with antistatic layers of this invention. Additional benefits resulting from the decrease in tin oxide to gel ratio include decreased optical density and minimized image tone change.

SUMMARY OF THE INVENTION

The present invention is an imaging element which includes a support, an image-forming layer superposed on the support and an electrically-conductive layer superposed on the support. The electrically-conductive layer includes an electrically-conductive particle having an average particle size less than 0.1 micrometer and a binder, said binder comprising at least 25 weight percent of a polyesterionomer.

Figure 1:
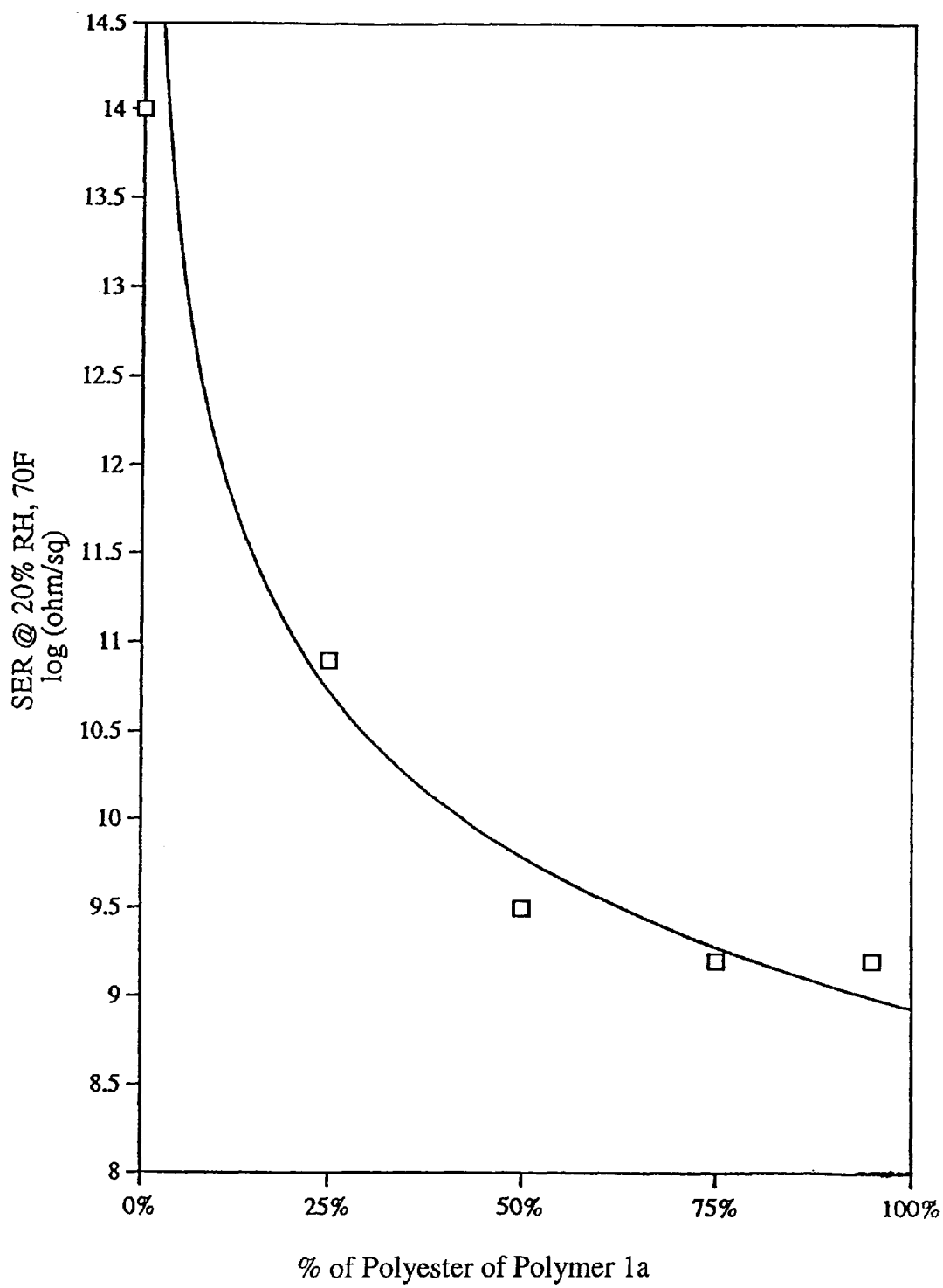
FIG. 1 shows the relationship between surface electrical resistivity and the binder composition in an electrically conductive layer.

For a better understanding of the present invention together with other advantages and capabilities thereof, reference is made to the following detailed description and appended claims.

DETAILED DESCRIPTION OF THE INVENTION

This invention relates to improved optically transparent, electrically conductive layers containing colloidal electrically conductive granular particles and a polymeric binder system for use in imaging elements. The method for preparing the electrically conductive layers includes reducing the average size of the electrically conductive granular particles by means of attrition milling in the presence of a polyanionic dispersing aid to obtain a stable aqueous colloidal dispersion. The colloidal dispersion is combined with a binder system and other additives, and applied in the form of a thin layer to a support. The resulting conductive layer exhibits improved electrical properties i.e. lower resistivities at electrically conductive particle to binder ratios and superior dynamic wettability in comparison to layers of the prior art.

The choice of the particular polyesterionomer to be incorporated in the binder system is extremely important to the present invention. The polyesterionomer should be incorporated as a binder or mixed at an appropriate ratio with gelatin in the tin oxide layer so as to maintain the physical integrity of the layer.

Electrically-conductive granular particles in the electrically conductive layer of the present invention may be composed of conductive crystalline inorganic oxides, conductive metal antimonates, or conductive inorganic non-oxides. Crystalline inorganic oxides may be chosen from ZnO, $TiO_2$, $SnO_2$, $Al_2O_3$, $In_2O_3$, $SiO_2$, MgO, BaO, $MoO_3$, $WO_3$, $V_2O_5$, $HfO_2$, $ThO_2$, $ZrO_2$ and $CeO_2$ or composite oxides thereof. Additional conductive metal oxides include an excess-oxygen oxide such as $Nb_2O_{5+x}$, an oxygen deficiency oxide such as $RhO_{2-x}$, and $Ir2O_{3-x}$ or a non-stoichiometeric oxide such as $Ni(OH)_x$. The conductive crystalline inorganic oxides may contain a "dopant" in the range from 0.01 to 30 mole percent, preferred dopants being Al or In for ZnO; Nb or Ta for $TiO_2$; and Sb, Nb or halogens for $SnO_2$. Alternatively, conductivity can be enhanced by formation of oxygen defects by methods well known in the art. Preferred conductive crystalline inorganic oxides are antimony-doped tin oxide, aluminum-doped zinc oxide and niobium-doped titania. A particularly preferred crystalline inorganic oxide is antimony-doped tin oxide at an antimony doping level of at least 8 atom percent and having an X-ray crystallite size less than 100 Å and an average equivalent spherical diameter less than 15 nm but no less than the X-ray crystallite size as taught in U.S. Pat. No. 5,484,694.

Conductive metal antimonates which may be used in the present invention have a rutile or rutile-related crystallographic structure and may be represented as $M^{+2}Sb^{+5}_2O_6$ (where $M^{+2}=Zn^{+2}$, $Ni^{+2}$, $Mg^{+2}$, $Fe^{+2}$, $Cu^{+2}$, $Mn^{+2}$, $Co^{+2}$) or $M^{+3}Sb^{+5}O_4$ (where $M^{+3}=In^{+3}$, $Al^{+3}$, $Sc^{+3}$, $Cr^{+3}$, $Fe^{+3}$). Several colloidal conductive metal antimonate dispersions are commercially available from Nissan Chemical Company in the form of aqueous or organic dispersions. Alternatively, U.S. Pat. Nos. 4,169,104 and 4,110,247 teach a method for preparing $M^{+2}Sb^{+5}_2O_6$ by treating an aqueous solution of potassium antimonate with an aqueous solution of an appropriate metal salt (e.g., chloride, nitrate, sulfate, etc.) to form a gelatinous precipitate of the corresponding insoluble hydrate which may be converted to a conductive metal antimonate by suitable treatment. Suitable particle size for metal antimonate particles is less than about 0.2 $\mu$m and more preferably less than about 0.1 $\mu$m.

Conductive inorganic non-oxides suitable as conductive particles in the present invention include: TiN, $TiB_2$, TiC, $NbB_2$, WC, $LaB_6$, $ZrB_2$, MoB, and the like, as described in Japanese Kokai No. 4/55492, published Feb. 24, 1992.

Electrically-conductive metal-containing acicular particles used in accordance with this invention are preferably single-phase, crystalline, and have nanometer-size dimensions. Suitable dimensions for the acicular conductive particles are less than 0.05 $\mu$m in cross-sectional diameter (minor axis) and less than 1 $\mu$m in length (major axis), preferably less than 0.02 $\mu$m in cross-sectional diameter and less than 0.5 $\mu$m in length, and more preferably less than 0.01 $\mu$m in cross-sectional diameter and less than 0.15 $\mu$m in length. These dimensions tend to minimize optical losses of coated layers containing such particles due to Mie-type scattering by the particles. A mean aspect ratio (major/minor axes) of at least 3:1 is suitable; a mean aspect ratio of greater than or equal to 5:1 is preferred; and a mean aspect ratio of greater than or equal to 10:1 is more preferred for acicular conductive metal-containing particles in accordance with this invention.

One particularly useful class of acicular, electronically-conductive, metal-containing particles comprises acicular, semiconductive metal oxide particles. Acicular, semiconductive metal oxide particles suitable for use in the conductive layers of this invention exhibit a specific (volume) resistivity of less than $1\times10^4$ ohm.cm, more preferably less than $1\times10^2$ ohm.cm. One example of such a preferred acicular semiconductive metal oxide is the acicular electroconductive tin oxide described in U.S. Pat. No. 5,575,957 which is available under the tradename "FS-10P" from Ishihara Techno Corporation. Said electroconductive tin oxide comprises acicular particles of single-phase, crystalline tin oxide doped with about 0.3–5 atom percent antimony as a solid solution. The mean dimensions of the acicular tin oxide particles determined by image analysis of transmission electron micrographs are approximately 0.01 μm in cross-sectional diameter and 0.1 μm in length with a mean aspect ratio of about 10:1. Other suitable acicular electroconductive metal oxides include, for example, a tin-doped indium sesquioxide similar to that described in U.S. Pat. No. 5,580,496, but with a smaller mean cross-sectional diameter, aluminum-doped zinc oxide, niobium-doped titanium dioxide, an oxygen-deficient titanium suboxide, $TiO_x$, where $x<2$ and a titanium oxynitride, $TiO_xN_y$, where $(x+y) \leq 2$, similar to those phases described in U.S. Pat. No. 5,320,782. Additional examples of other non-oxide, acicular, electrically-conductive, metal-containing particles include selected fine particle metal carbides, nitrides, suicides, and borides prepared by various methods.

Preferred electrically conductive particles are conductive Sb-doped tin oxide powders commercially available from a number of sources (e.g., Keeling & Walker Ltd., Dupont Ishihara Sangyo Kaisha, Performance Chemicals, Mitsubishi Metals, Nissan Chemical Industries, etc.). These commercial conductive powders are prepared by means of a variety of manufacturing processes including—traditional ceramic, hybrid ceramic, coprecipitation, spray pyrolysis, hydrothermal precipitation, as well as other processes. In the traditional ceramic process, finely ground powders of tin oxide and an antimony oxide are intimately mixed, heat-treated at elevated temperatures (>700° C.) for various periods of time, and subsequently remilled to a fine powder. In one variation of the ceramic process (GB Pat No. 2,025, 915) an insoluble tin containing precursor powder is prepared by precipitation from solution, treated with a solution of a soluble antimony compound, then the slurry is dried, and the resulting powder heat-treated as in the ceramic process. This method is alleged to achieve a more homogeneous distribution of the antimony dopant throughout the bulk of the particles. It is possible to prepare even more homogeneously doped powders by means of a variety of other chemical coprecipitation processes including steps with heat treatment temperatures lower than those used for typical ceramic processes. In some of the coprecipitation processes, the separate heat treatment step is eliminated altogether (e.g., hydrothermal precipitation).

All the commercial Sb-doped tin oxide samples suitable for use in the method of this invention have Sb dopant levels less than 20 atom % Sb. Suitable Sb-doped tin oxide colloidal dispersions also must exhibit a very small average particle size. A small particle size minimizes light scattering, which would result in reduced optical transparency of the conductive coating. The relationship between the size of a particle, the ratio of its refractive index to that of the medium in which it is incorporated, the wavelength of the incident light, and the light scattering efficiency of the particle is described by Mie scattering theory (G. Mie, Ann. Physik., 25, 377(1908)). A discussion of this topic as it is relevant to photographic applications has been presented by T. H. James ("The Theory of the Photographic Process", 4th ed, Rochester: EKC, 1977).

In the case of Sb-doped tin oxide particles coated in a thin layer employing a typical photographic gelatin binder system, it is necessary to use powders with an average particle size less than about 0.1 micrometer in order to limit the scattering of light at a wavelength of 550 nm to less than about 10%. For shorter wavelength light, such as ultraviolet light used to expose daylight insensitive graphic arts films, particles less than about 0.08 micrometer in size are preferred.

In addition to ensuring transparency of thin conductive layers, a small average particle size is needed to form the multiplicity of interconnected chains or networks of conductive particles, which provide multiple electrically conductive pathways. In the case of the preferred commercially available Sb-doped tin oxide bulk powders, the average particle size (typically 0.5–0.9 micrometer) must be reduced substantially by various attrition milling processes, such as small media milling, well known in the art of pigment dispersion and paint making. However, not all commercial Sb-doped tin oxide powders are sufficiently chemically homogeneous to permit the extent of size reduction required to ensure both optical transparency and multiple conductive pathways and still retain sufficient particle conductivity to form conductive networks in thin coated layers. Average primary particle sizes (determined from TEM micrographs) of less than about 10 nm for the preferred Sb-doped tin oxides permit extremely thin conductive layers to be coated. These layers exhibit comparable conductivity to much thicker layers containing larger size particles (e.g., >50 nm) of other nonpreferred Sb-doped tin oxides.

The ratio of the weight of the electrically conductive particles to the binder in the dispersion is another critical factor which strongly influences the ultimate conductivity and adhesion achieved by the coated layer. if this ratio is small, little or no antistatic property is exhibited. If the ratio is very large, adhesion between the conductive layer and the support or overlying layers can be diminished. The optimum ratio of conductive particles to binder varies depending on the particle size, binder type, and conductivity requirements. The volume fraction of electrically conductive particles is preferably in the range of from about 20 to 80% of the volume of the coated layer. For Sb-doped tin oxide, this corresponds to a tin oxide to binder weight ratio of about 60:40 to 96:4. The dry coated weight of Sb-doped tin oxide in the conductive layer is preferably in the range of from about 1 to about 200 $mg/ft^2$. The dry coverage of the preferred Sb-doped tin oxide is most preferably in the range of about 3 to 50 $mg/ft^2$.

For constant values of electrically conductive particles to binder ratio, coatings containing the preferred polyesterionomer or gelatin-polyesterionomer blend binder system exhibit superior electrical properties (lower resistivity) relative to the prior art. Thus, one major advantage of the conductive layers afforded by the method of this invention is that comparable electrical characteristics i.e. surface resistivities can be provided at lower tin oxide to binder ratios and lower dry weight coverages of Sb-doped tin oxide than by teachings in the prior art. Further, for coatings prepared at equivalent dry weight coverages of tin oxide, the weight ratio of tin oxide to binder in coatings prepared from dispersions formulated using the preferred binder systems can be substantially less than those for gelatin-only Sb-doped tin oxides and still maintain comparable electrical conductivity.

Another major advantage of the conductive layers afforded by the method of this invention is that superior dynamic wettability characteristics i.e. higher air entrainment speeds can be provided. Thus, for constant values of tin oxide coverage and pigment to binder ratio, coatings containing the preferred polyesterionomer or gelatin-polyesterionomer blend binder system exhibit superior dynamic wettability characteristics.

Polymeric binder systems useful in conductive layers prepared by the method of this invention include: polyesterionomers or blends of polyesterionomer and water soluble polymers such as gelatin, gelatin derivatives, maleic anhydride copolymers; cellulose compounds such as carboxymethyl cellulose, hydroxyethyl cellulose, cellulose acetate butyrate, diacetyl cellulose or triacetyl cellulose; synthetic hydrophilic polymers such as polyvinyl alcohol, poly-N-vinylpyrrolidone, acrylic acid copolymers, polyacrylamide, their derivatives and partially hydrolyzed products, vinyl polymers and copolymers such as poly(vinyl acetate-co-acrylic acid/ester); derivatives of the above polymers; and other synthetic resins. Other water soluble binders suitable for blending with polyester ionomers include aqueous emulsions of addition-type polymers and interpolymers prepared from ethylenically unsaturated monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes.

In accord with the present invention, polyesterionomers functionalized with electron donors are provided comprising condensation polymers containing, as repeating units, the condensation residues of:

(a) a diacid, and (b) an organic difunctional compound capable of undergoing condensation polymerization with said diacid, wherein at least one of said residues contains an arylamine electron donor group.

In accord with the present invention, the condensation polymers are ionic and in such an embodiment contain, as repeating units, the condensation residues of:

(a) a first diacid, (b) a second diacid containing an anionic iminodisulfonyl, carboxylic, phosphonate, phosphate, borate or sulfonium group, and (c) at least one organic difunctional compound capable of undergoing condensation polymerization with said first and second diacids, wherein at least one of said first diacid and organic difunctional compound residues contains the arylamine electron donor group.

Coatings of polyesterionomers containing electrically conductive particles exhibit exceptionally high degrees of conductivity.

Furthermore, the present polymers are readily rendered water-dispersible without sacrificing the dispersibility of the polymers in non-aqueous solvents.

Polyesterionomers of the present invention having electron donor groups as part of the backbone are represented by the structural formula:

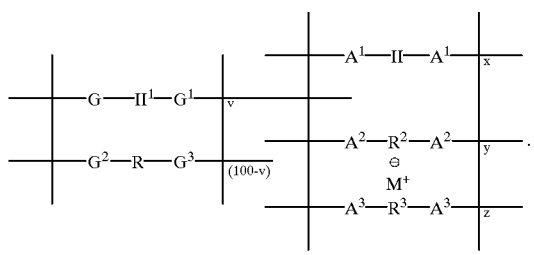

Polyesterionomers of the present invention having electron donor groups as a pendant group are represented by the structural formula:

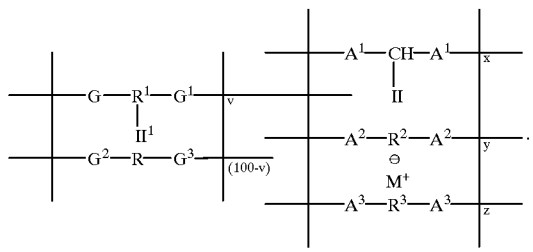

For both formulae I and Ia, $\pi$ and $\pi^1$, which are the same or different, are organic groups containing an arylamine; $R^1$-$\pi^1$ together with G and $G^1$ represents an organic condensation residue of a difunctional compound capable of undergoing condensation with organic diacids; R together with $G^2$ and $G^3$ represents the organic condensation residue of at least one difunctional compound capable of undergoing condensation with organic diacids; G and $G^1$, which are the same or different, and $G^2$ and $G^3$, which are the same or different, represent —O— or —NH—; $A^1$, $A^2$ and $A^3$, which are the same or different, represent the residue of acid groups such as

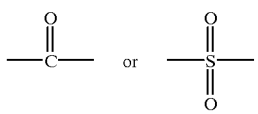

$R^2$— is an organic group which contains an anionic iminodisulfonyl, carboxylic, phosphonate, phosphate, borate or sulfonium group; M+ is a cation such as ionic sodium, lithium, ammonium, phosphonium, potassium or hydrogen; -$A^3$-$R^3$-$A^3$ represents an organic diacid condensation residue; x is 0 to 100, preferably 10 to 60 mole percent of the total diacid content; y is 5 to about 50 mole percent of the total diacid content, and z is 0 to 85 mole percent of the total diacid content; the sum of x, y and z is 100; v is 0 to 100 mole percent of the total difunctional compound content. When v+x is at least 20 the polyesterionomer contains an electron donor group.

As indicated by formulae I and Ia, $\pi$ and $\pi^1$ represent organic groups containing an arylamine donor. Representative examples of $\pi$ and $\pi^1$, include tertiary amine pendant groups corresponding to the structure:

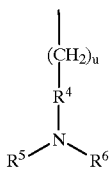

wherein u is an integer from 1 to 6, preferably 1, and $R^5$ and $R^6$ are the same or different and represent alkyl, cycloalkyl, aryl or aralkyl and $R^4$ represents alkylene, cycloalkylene, arylene or arylenealkylene, with the proviso that at least one of $R^4$, $R^5$ and $R^6$ comprises an aromatic group appended to the nitrogen atom. Preferred aryl and arylene groups include phenyl, tolyl, phenylene and tolylene. Preferably, $R^4$, $R^5$ and $R^6$ are each aromatic.

In those instances when the arylamine donor group is provided by repeating units of a difunctional compound capable of undergoing condensation with organic diacids, the polymers of the present invention comprise one or more recurring units containing $R_1$-$\pi^1$ in structure Ia above. $R^1$-$\pi^1$ together with G and $G^1$ represents the arylamine-containing condensation residue of an organic difunctional compound remaining after condensation with an organic diacid or functional equivalent of a diacid. $R^1$ is generally an organic radical having from about 2 to 40 carbon atoms, including optional non-carbon atoms. Exemplary $R^1$ radicals include hydrocarbon radicals, such as straight and branched chain alkylene radicals (e.g., ethylene, propylene, 2,2-dimethyl-1,3-propylene, etc.), cycloalkylene radicals (e.g., cyclohexylene, cycloheptylene, etc.), and arylene radicals (e.g., phenylene); and hydrocarbon-oxy-hydrocarbon radicals, such as alkylene-oxy-alkylene and alkylene-oxy-cycloalkylene-oxy-alkylene.

Polymers according to formula I and Ia also can contain the recurring unit

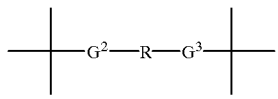

the condensation residue of at least one difunctional compound capable of undergoing condensation with organic diacids. R is generally, therefore, an organic radical having from about 2 to 40 carbon atoms, including optional non-carbon atoms. Exemplary radicals include hydrocarbon radicals, such as straight and branched chain alkylene radicals (e.g., ethylene, propylene, 2,2-dimethyl-1,3-propylene, etc.), cycloalkylene radicals (e.g., cyclohexylene, cycloheptylene, etc.), and arylene radicals (e.g., phenylene); and hydrocarbon-oxy-hydrocarbon radicals, such as alkylene-oxy-alkylene and alkylene-oxy-cycloalkylene-oxy-alkylene.

Representative $R^2$ groups containing the anionic iminodisulfonyl carboxylic, phosphonate, phosphate, borate or sulfonium group

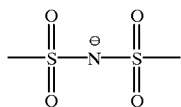

or the anionic sulfo group

include one or more groups corresponding to the following structures:

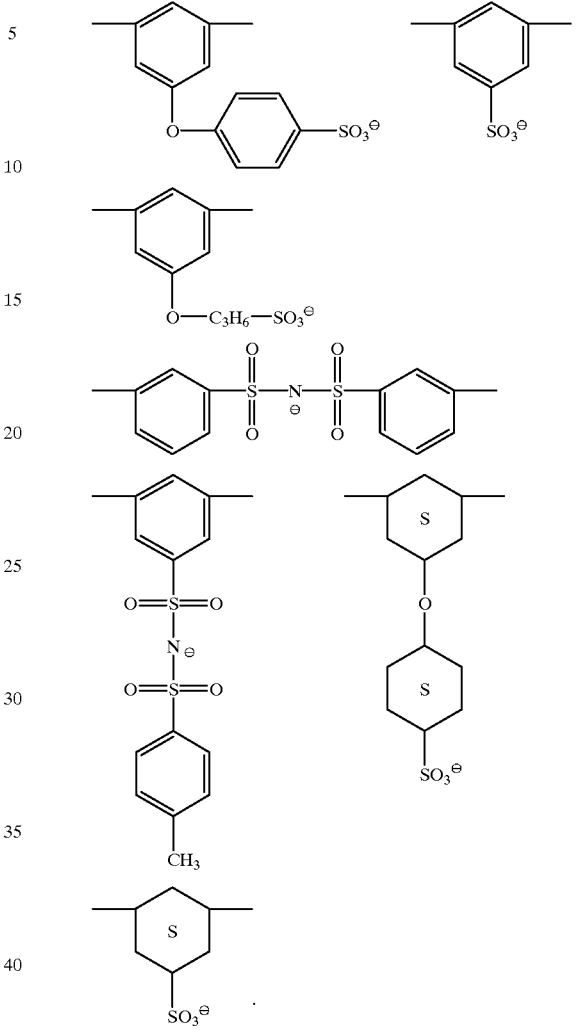

Polymeric electron donors defined herein comprise, when desired, additional repeating units for any desired purpose such as varying solubility, charge control, compatibility with other components, adhesion, and toughness. Accordingly, the present polymers include optional repeating units represented, for example, by

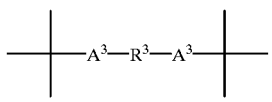

in formula I which signifies one or more organic diacid condensation residues. Accordingly, representative R3 groups include unsubstituted and substituted alkylene, arylene, arylenealkylene, cycloalkylene, heterocyclic groups and ethylenically unsaturated groups.

In the preferred embodiment, the polyesterionomer containing electron donors are ionic and contain in this embodiment, as repeating units, the condensation residues of:

(a) a first dicarboxylic acid,
(b) a second dicarboxylic acid containing an anionic iminodisulfonyl or sulfo group, and (c) at least one organic diol capable of undergoing condensation polymerization with said first and second dicarboxylic acids, wherein at least one of said first dicarboxylic acid and organic diol residues contains a pendant arylamine electron donor group.

Polyester electron donors of the present invention are accordingly represented by the structural formula:

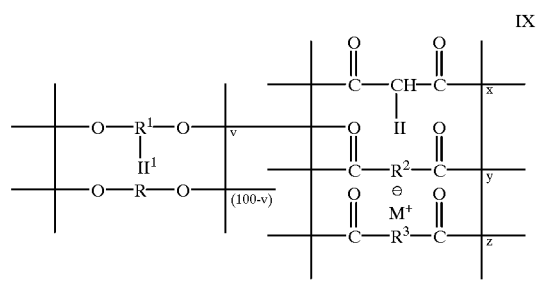

IX wherein R, $R^1$, $R^2$, $R^3$, M+, $\pi$, $\pi^1$, x, y, z and v are as defined with respect to formula I above.

In the preferred polyesters according to the present invention, the second dicarboxylic acid units, designated in formula IX as,

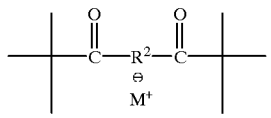

can comprise residues of various conventional dicarboxylic acids such as phthalic acids, isophthalic acids, terephthalic acids and cyclohexanedicarboxylic acids. Bis-benzoic acids comprising benzoic acid moieties linked symmetrically about other groups such as iminodisulfonyl anionic groups are also advantageously employed. In each instance, of course, the repeating unit contains an anionic iminodisulfonyl or sulfo group and the M+ counterion.

Exemplary preferred dicarboxylic acids having an anionic iminodisulfonyl group include 3,3'-[(sodioimino)disulfonyl] dibenzoic acid; 3,3'-[(potassioimino)disulfonyl]dibenzoic acid; 3,3'-[(lithioimino)disulfonyl]dibenzoic acid; 4,4'-[(lithioimino)disulfonyl]dibenzoic acid; 4,4'-[(sodioimino) disulfonyl]dibenzoic acid; 4,4'-[(potassioimino)disulfonyl] dibenzoic acid; 3,4'-[(lithioimino)disulfonyl]dibenzoic acid; 3,4'-[(sodioimino)disulfonyl]dibenzoic acid; 4,4'-[(potassiomino)disulfonyl]dinaphthoic acid; 5-[N-potassio-N-(4-tolylsulfonyl)sulfamoyl]isophthalic acid and functional derivatives thereof. These and other dicarboxylic acids are disclosed in U.S. Pat. No. 3,546,180 of Caldwell et al issued Dec. 8, 1970, and U.S. Pat. No. 3,929,489 of Arcesi et al issued Dec. 30, 1975, the disclosures of which are incorporated herein by reference.

Preferred dicarboxylic acids having an anionic sulfo group include 5-sodiosulfoisophthalic acid, 5-(4-sodiosulfophenoxy)isophthalic acid, 5-(3-sodiosulfopropoxy)isophthalic acid, 5-sodiosulfo-1,3-cyclohexanedicarboxylic acid and 5-(4-sodiosulfocyclohexyloxy)-1,3-cyclohexanedicarboxylic acid and functionally equivalent derivatives thereof.

Considering all components, in a preferred polyester ionomer containing electron donors according to formula IX above v=0, $\pi$ contains triphenylamine or di-p-tolylphenylamine,

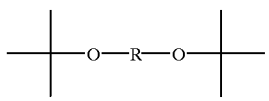

is derived from an organic diol selected from the group consisting of alkylenediol, di(hydroxyalkyl)cyclohexane and di(hydroxyalkoxy)cyclohexane;

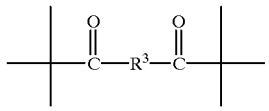

is derived from an aromatic dicarboxylic acid such as phthalic acid, isophthalic acid or terephthalic acid; and

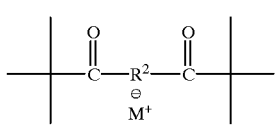

comprises either an anionic iminodisulfonyl or anionic sulfo group linked to the residue of an organic dicarboxylic acid selected from the group consisting of phthalic acids, isophthalic acids, terephthalic acids, bis(benzoic acids) or cyclohexanedicarboxylic acids; and x is from about 10 to about 60 mole percent, z is 0 to about 85 mole percent, y is from about 5 to about 50 mole percent, and v is 0.

In certain of the polyester ionomers water-dispersibility is provided by employing a molar percentage (y in formula IX) of the ionic diacid repeating unit that is sufficient to confer water-dispersibility on formula IX. In this regard, water-dispersibility signifies that the resulting polyester will form a stable aqueous composition comprising a dispersion or solution containing at least 3 weight percent of the polyester that is stable for at least two months, usually six months or more, with essentially no visible signs of agglomeration or crystallization. Preferred water-dispersible polyesters of the present invention that form such aqueous compositions correspond to formula IX wherein y is from about 5 to about 50, and x is from about 10 to about 60, and v is 0.

As shown in connection with formula Ia above, $\pi$ and $\pi^1$ groups containing arylamine donor groups are appended to a diacid residue or difunctional organic compound residue in the defined polymers. Such arylamine groups are attached to the diacid side of the polymer, for example, by basic condensation of an arylamine having an aldehyde substituent with an active methylene of a diacid radical to produce an unsaturated bond joining the electron donor to the diacid radical. The unsaturated bond is thereafter reduced by hydrogenation over a palladium/charcoal catalyst. Schematically, the preparation of the arylamine-containing group is shown as follows:

(A)

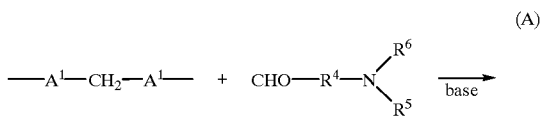

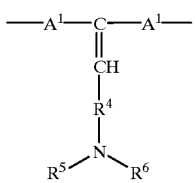

wherein $A^1$, $R^4$, $R^5$ and $R^6$ are defined above.

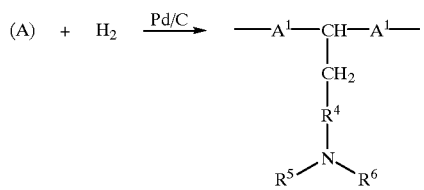

The arylamine electron donor group is attached to the diacid precursor of the defined polymer followed by polycondensation of the diacid component with the other appropriate condensation polymer components. Alternatively, the arylamine is attached to the diacid component of a preformed polymer. The alternative method is preferred in the event that high molecular weight polymers are desired.

When it is desirable to append the arylamine to a difunctional organic compound, particularly a diol, that is capable of undergoing condensation polymerization with the diacid precursors in the defined polymers, dicarboxcyclic acids containing the pendant arylamine can be chemically reduced to yield the corresponding diol. Alternatively, attachment of the arylamine to organic diamines or hydroxyamines can be carried out by known techniques such as by attaching the arylamine to an organic compound already having the amine or hydroxyamine functionality. Alternatively, an arylamine can be treated to form the diamine or hydroxyamine functionality.

The polymers described herein, with or without pre-attached arylamine groups, are prepared by procedures will known in the art for making linear condensation polymers, particularly interfacial, solution or ester interchange procedures, the latter being preferred for polyesters. Reaction times are governed by the inherent viscosity desired for the resulting polymer. For purposes of illustration, exemplary procedures for the preparation of polyesters (formula IX) are described hereinafter.

When employing interfacial procedures, polymerization is carried out in suitable halogenated solvents, such as methylene chloride, chloroform, dichloroethane, or propylene dichloride. Reaction temperatures are governed by maintenance of a practical rate of reaction and the boiling point of the solvent, with a range of 10° to 40° C. being suitable.

Solution polymerization procedures can be carried out by condensing suitable acid halides, such as terephthaloyl, isophthaloyl, or cyclohexanedicarboxylic acid chlorides, with the desired diols in a suitable solvent, in the presence of a suitable acid acceptor, such as pyridine, triethylamine, or tripropylamine. The acid acceptor can be employed in excess to serve as the solvent.

A preferred mode of preparing the polyesters disclosed herein is the ester interchange procedure either by melt or powder process, and preferably by the melt process. The diols and the carboxylates are heated to a melt on an approximately equal molar basis and treated with a transesterification catalyst such as alkali or alkaline earth metal carbonates, oxides, hydroxides, hydrides, and alkoxides; or compounds of a Group IVB metal of the Periodic Table, such as tetraisopropylorthotitanate, butyl titanate, organometallic halides, and complex alkoxides such as NaHTi(OCH$_9$)$_2$. As a practical matter, it is frequently desirable to utilize an excess of up to about 80 molar percent of the diol component in the reaction mixture. Low boiling alcohols are removed by distillation during polymerization.

The condensation polymers described herein exhibit an inherent viscosity of from about 0.10 to about 0.50 and preferably from 0.1 to 0.4 as measured at 25° C. at a concentration of 0.25 g/deciliter in a 1:1 mixture of phenol and chlorobenzene.

The polymers described herein have a glass transition temperature within the range of about 30° C. to about 90° C. as determined by differential scanning calorimetry as disclosed in "Techniques and Methods of Polymer Evaluation", Vol. 2, Marcel Dekker, Inc., N.Y., 1970.

The structures of representative polyesters containing appended arylamine electron donors as described herein are shown in Table I below (mole percentages set forth by parenthesis indicate a separate polymer of the structure shown):

TABLE I
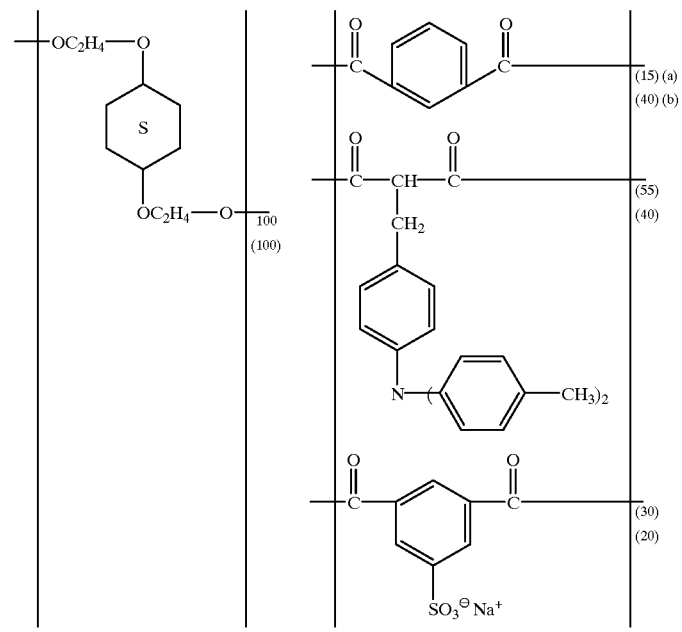
Polymer 1
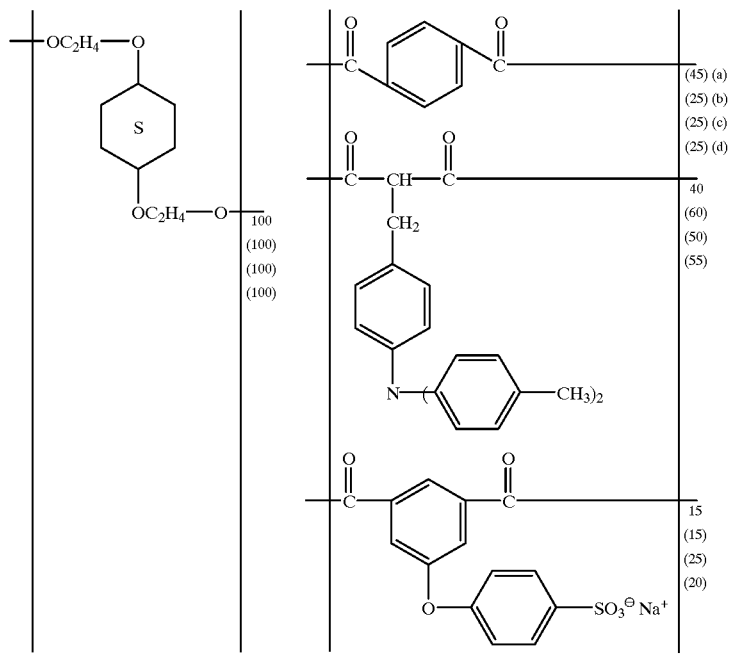
Polymer 2

TABLE I-continued
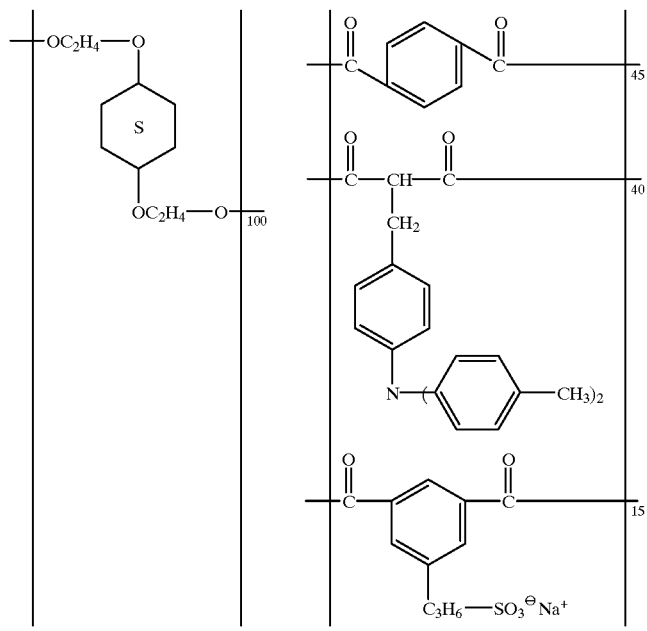
Polymer 3
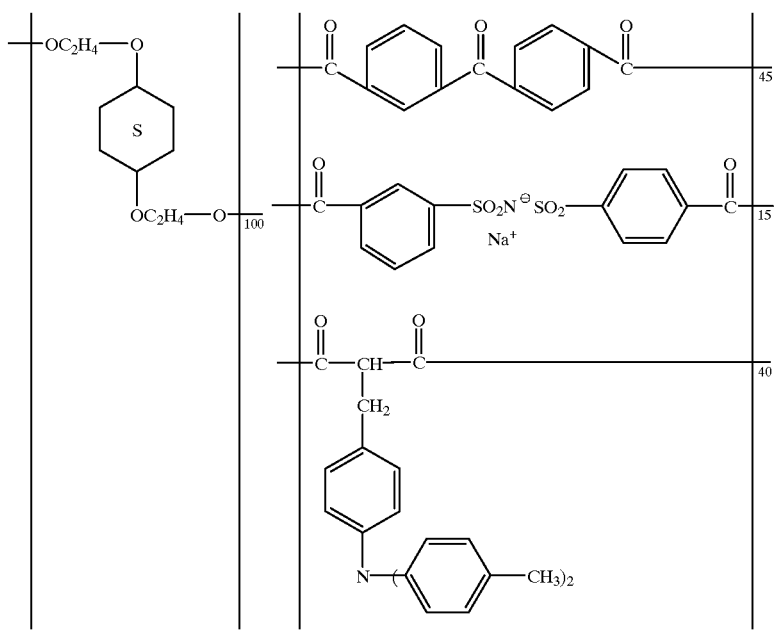
Polymer 4

TABLE I-continued

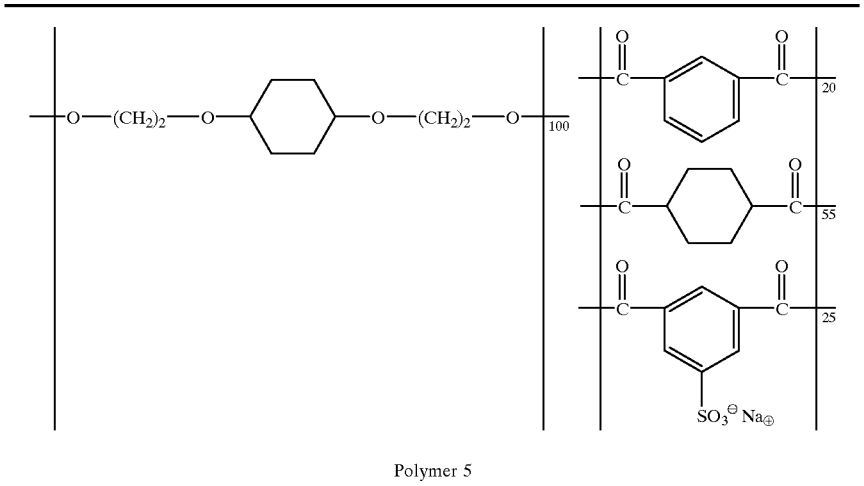

Polymer 5

POLYMERIZATION PROCEDURE

All of the polymers described in Table I can be synthesized by the standard high temperature melt condensation procedure described below. Polyesters are described for purposes of illustration.

A polymerization flask was charged with the appropriate diols and diesters. The flask was equipped with a Vigreaux condenser. The condenser was fitted with a nitrogen inlet tube and gas flushed through the system at 40 ml/min. The flask was immersed in a 235° C. salt bath to just below the stoppered side arm. When the chemical mixture became a homogeneous melt, one drop of tetraisopropyl orthotitanate was added as a catalyst.

The volatiles were distilled at 235° C. and at atmospheric pressure for 4 hrs. The condenser and inlet tube were replaced with a stainless steel stirrer attached so as to be vacuum tight. A vacuum was drawn to about 0.05 mm Hg, the polymer stirred at 200 rpm and the torque applied by the melt to the stirrer measured. When the torque indicated the desired degree of polymerization, the stirring and vacuum were stopped and the polymerization flask removed from the bath as quickly as possible. The polymerization flask was immersed in liquid nitrogen and the flask broken away from the solidified glassy polymer.

This illustrates the attachment of the triarylamine electron donor group to a malonate diacid. The resulting malonate-electron donor diacid was then polymerized as described above with appropriate glycols and other diacids to produce polyesters in Table I.

A five-liter, three-necked, round-bottom flask equipped with stirrer, thermometer, Dean Stark trap, and condenser was charged with 391.8 g of di-p-tolylaminobenzaldehyde, 208 g of diethyl malonate, 11 ml of piperidine, 13 ml of acetic acid, and 1500 ml of toluene. The reaction solution was refluxed for 6 hours, and during this time 32 ml of water was collected. The reaction was cooled and the toluene was evaporated. The product was taken up in 900 ml of ethanol, and the ethanol was slowly reduced in volume by evaporation. The crystalline product was collected, and had a melting point of 99–105° C. The product was recrystallized again from ethanol, dried, and had a melting point of 104–106° C. The yield was 494 g. The condensation product, diethyl 4-[N,N-di-p-tolylamino] benzylidenemalonate, was reduced using palladium over charcoal as the catalyst.

Solvents useful for preparing dispersions and coatings of conductive metal oxide particles by the method of this invention include: water; alcohols such as methanol, ethanol, propanol, 2-propanol; ketones such as acetone, methylethyl ketone, and methylisobutyl ketone; esters such as methyl acetate, and ethyl acetate; glycol ethers such as methyl cellusolve, ethyl cellusolve; and mixtures thereof.

In addition to binders and solvents, other components that are well known in the photographic art may also be present in the conductive layer of the present invention. These additional components include: surfactants and coating aids, thickeners, crosslinking agents or hardeners, soluble and/or solid particle dyes, antifoggants, matte beads, lubricants, and others.

Colloidal dispersions of conductive metal oxide particles formulated with preferred polymeric binder blends and additives can be coated onto a variety of photographic supports including: polyethylene terephthalate, polyethylene naphthalate, polycarbonate, polystyrene, cellulose nitrate, cellulose acetate, cellulose acetate butyrate, cellulose acetate propionate, and laminates thereof. Suitable supports can be either transparent or opaque depending upon the application. Transparent film supports can be either colorless or colored by the addition of a dye or pigment. The film supports can be surface treated by various processes including corona discharge, glow discharge, UV exposure or solvent washing, overcoated with polymers such as vinylidene chloride containing copolymers, butadiene-based copolymers, glycidyl acrylate or methacrylate containing copolymers or maleic anhydride containing copolymers. Suitable paper supports include polyethylene-, polypropylene-, and ethylene-butylene copolymer-coated or laminated paper and synthetic papers.

Formulated dispersions of Sb-doped tin oxide particles and preferred polymeric binder can be applied to the aforementioned film or paper supports by any of a variety of well-known coating methods. Hand coating techniques include using a coating rod or knife or a doctor blade. Machine coating methods include skim pan/air knife coating, roller coating, gravure coating, curtain coating, bead coating or slide coating.

Conductive layers of this invention can be applied to the support in any of various configurations depending upon the requirements of the specific application. In the case of photographic elements for graphics arts applications, a conductive layer can be applied to the polyester film base during the support manufacturing process after orientation of the cast resin on top of a polymeric undercoat layer. A conductive layer also can be applied as a subbing layer under the sensitized emulsion, or on the side of the support opposite the emulsion as well as on both sides of the support. When a conductive layer containing colloidal conductive metal oxide particles is applied as a subbing layer under the sensitized emulsion, it is not necessary to apply any intermediate layers such as barrier layers or adhesion promoting layers between it and the sensitized emulsion, although they can optionally be present. Alternatively, a conductive layer can be applied as part of a multi-component curl control layer on the side of the support opposite to the sensitized emulsion. The conductive layer would typically be located closest to the support. An intermediate layer, containing primarily binder and antihalation dyes functions as an antihalation layer. The outermost layer containing binder, matte, and surfactants functions as a protective overcoat. Other addenda, such as polymer latices to improve dimensional stability, hardeners or cross linking agents, surfactants, and various other conventional additives can be present optionally in any or all of the layers.

In the case of photographic elements for direct or indirect x-ray applications, the conductive layer can be applied as a subbing layer on either side or both sides of the film support. In one type of photographic element, the conductive subbing layer is applied to only one side of the support and the sensitized emulsion coated on both sides of the film support. Another type of photographic element contains a sensitized emulsion on only one side of the support and a pelloid containing gelatin on the opposite side of the support. A conductive layer can be applied under the sensitized emulsion or alternatively, the pelloid. Additional optional layers can be present. In another photographic element for x-ray applications, a conductive subbing layer can be applied under or over a gelatin subbing layer containing an antihalation dye or pigment. Alternatively, both antihalation and antistatic functions can be combined in a single layer containing conductive particles, antihalation dye, and a binder. Such a hybrid layer is typically coated on one side of a film support under the sensitized emulsion.

A conductive layer of this invention may also be used as the outermost layer of an imaging element, for example, as the protective overcoat that overlies a photographic emulsion layer. Alternatively, a conductive layer also can function as an abrasion resistant backing layer applied on the side of the film support opposite to the imaging layer.

Conductive layers of this invention can be included in an imaging element comprising a support, an imaging layer, and a transparent layer containing magnetic particles dispersed in a binder such as is described in U.S. Pat. No. 4,990,276; EP 459,349; *Research Disclosure,* Item #34390, p868, November 1992; and references cited therein. As disclosed in these publications, the magnetic particles can consist of ferro- and ferrimagnetic iron oxides, complex oxides including other metals, metallic alloy particles with protective coatings, ferrites, hexaferrites, etc. and can exhibit a variety of particulate shapes, sizes, and aspect ratios. The magnetic particles also can contain a variety of dopants and may be overcoated with a shell of particulate or polymeric materials. The conductive layer can be located beneath the magnetic layer as a subbing layer, overlying the magnetic layer as a backcoat or can be on the opposite side of the support from the magnetic layer underlying the emulsion layer as a subbing layer or overlying the emulsion layer as a topcoat.

The electrically-conductive layer of the present invention can further include matting agents, surfactants, coating aids, charge control agents, polymer latices, viscosity modifiers, hardeners, particulate dyes, antifoggants or lubricating agents.

Imaging elements incorporating conductive layers of this invention useful for other specific imaging applications such as color negative films, color reversal films, black-and-white films, color and black-and white papers, electrographic media, thermal dye transfer recording media, laser ablation media, and other imaging applications should be readily apparent to those skilled in photographic and other imaging arts.

The method of the present invention is illustrated by the following detailed examples of its practice. However, the scope of this invention is by no means restricted to these illustrative examples.

EXAMPLE 1

A coating mixture suitable for preparing an electrically conductive layer comprising colloidal electroconductive SN-100D Sb-doped tin oxide granular particles (Ishihara Sangyo Kaisha Ltd.), a gelatin binder, and various additives was prepared by combining 288.48 g of demineralized water, gelatin powder (88% solids), 0.0094 g of 10% solution of chrome alum (hardener), 0.2 g of 15% solution of saponin coating aid, 0.367 g of 2% aqueous dispersion of polymethylmethacrylate matte particles, 7.635 g of an aqueous dispersion of the colloidal Sb-doped tin oxide (30.56% solids).

The above-described coating composition was applied with a coating hopper to a 4-mil (100 micrometer) thick polyethylene terephthalate film support that has been previously coated on both sides with vinylidene chloride/acrylonitrile/itaconic acid terpolymer. The wet laydown of the coating composition applied to the film support was 1.35 ml/ft$^2$ (14.49 ml/m$^2$).

This corresponds to an antimony doped tin oxide dry weight coverage of 10.5 mg/ft$^2$.

The SER (log(surface electrical resistivity)) was determined after conditioning support samples for 24 hours at 20% R.H. using a two-probe parallel electrode method as described in U.S. Pat. No. 2,801,191.

The dynamic wettability RDC index was determined using the Rotating Disc Coater method described in U.S. Ser. No. 09/036,060. It has been found that the RDC index has predictive value for the coating processes used in manufacture of photographic products. Specifically, the speed at which air entrainment ceases on the RDC can be used to anticipate bead coating and curtain coating performance. Absolute speeds can differ, but relative performance can be predicted. Therefore, the speed at which air entrainment ceases for a receiving surface on the RDC is normalized by dividing that speed by the speed at which air entrainment ceases on the RDC for a reference surface that is conducive to coating, to obtained an index number having no dimensions.

The surface electrical resistivity (SER) and RDC index value for 65/35 tin oxide to gelatin weight ratio and 10.5 mg/ft$^2$, tin oxide coverage is reported in Table 2.

EXAMPLES 2–5

The coating compositions were prepared and coated as described in Examples 1 except that the 88% solids gelatin powder was partially replaced with the 19.6% solids aqueous dispersion of polyesterionomer (polymer 1) a as shown in Table I.

The surface resistivities and base wettability RDC Index values for these electrically-conductive layers were determined in the manner described in Example 1 and are reported in Table 2.

The relationship between the surface electrical resistivities (SER) and the gelatin-polyesterionomer (Polymer 1a) blend binder composition for 65/35 tin oxide to binder weight ratios is shown in FIG. 1.

Figure 2:
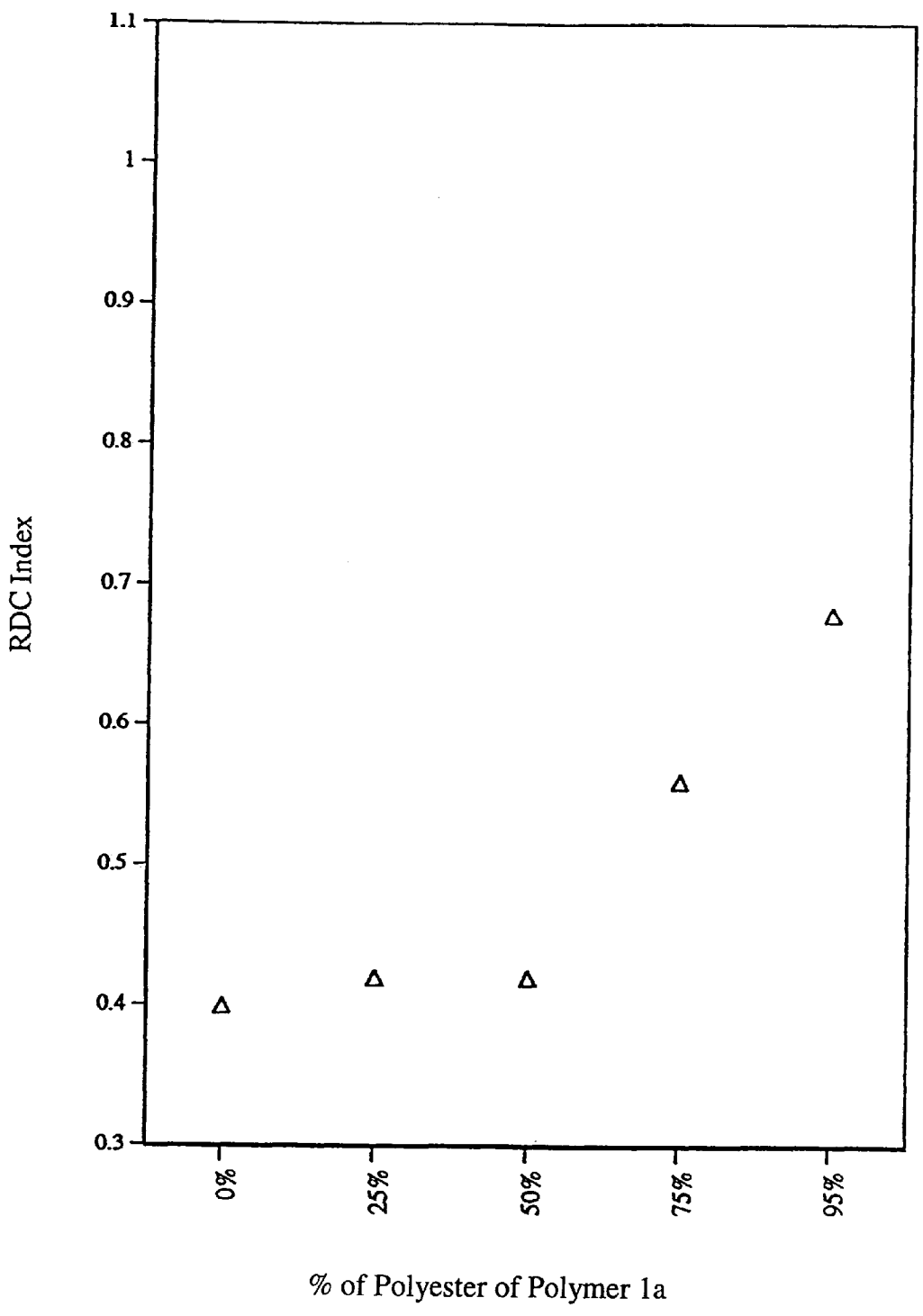
FIG. 2 shows the relationship between the support wettability and the binder composition in an electrically conductive layer.

The relationship between the RDC base wettability and the gelatin-polyesterionomer (Polymer 1a) blend binder composition for 65/35 tin oxide to binder weight ratios is shown in FIG. 2.

EXAMPLES 6–10

The coating compositions were prepared and coated as described in Examples (2–5) except that the 19.6% solids aqueous dispersion of polyesterionomer 1a was replaced with 19.6% solids aqueous dispersion of polyesterionomer (Polymer 5).

The surface resistivities for these electrically-conductive layers were determined in the manner described in Example 1 and are reported in Table 3.

Figure 3:
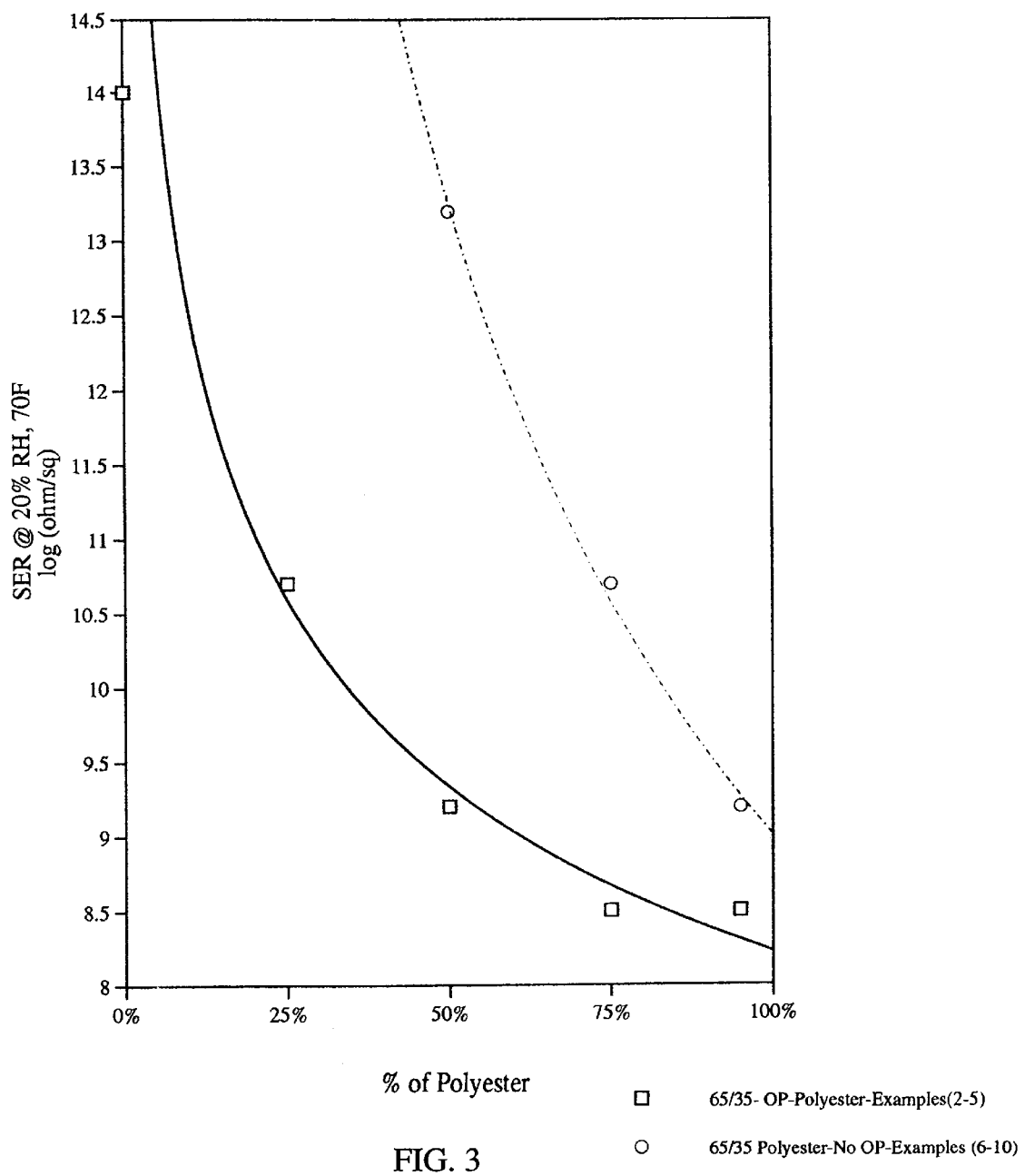
FIG. 3 shows the relationship between surface electrical resistivity and the binder composition in an electrically conductive layer for the Examples in FIG. 2.

The relationship between the surface electrical resistivities (SER) and the gelatin-polyesterionomer (Polymer 5) blend binder composition for 65/35 tin oxide to binder weight ratios is shown in FIG. 3.

ports subbed with antistatic layers of this invention. Additional benefits resulting from the decrease in tin oxide to gel ratio include decreased optical density and minimized image tone change.

The invention has been described in detail with particular reference to certain preferred embodiments thereof, but it will be understood that variations and modifications can be effected within the spirit and scope of the invention.

What is claimed is:

1. An imaging element comprising:
   a support;
   an image-forming layer superposed on the support;
   an electrically-conductive layer superposed on the support;
   said electrically-conductive layer comprising an electrically-conductive particle having an average particle size less than 0.1 micrometer and a binder, said binder comprising at least 25 weight percent of a polyesterionomer containing an arylamine electron donating moiety.

2. The imaging element of claim 1, wherein the electrically-conductive particles comprise metal containing particles.

3. The imaging element of claim 1, wherein the electrically-conductive particles comprise a volume percent of from 20 to 80 of said electrically-conductive layer.

4. The imaging element of claim 1, wherein the electrically-conductive layer further comprises matting agents, surfactants, coating aids, charge control agents, polymer latices, viscosity modifiers, hardeners, particle dyes, antifoggants or lubricating agents.

TABLE 2

| Example # | SnO2:Binder Ratio | SnO2 Coverage mg/ft2 | Gelatin | Polymer 1a | SER @ 20% RH | RDC Index | RDC Index Std Dev. |
|---|---|---|---|---|---|---|---|
| | | | | 19.6% Solids | | | |
| 1 | 65/35 | 10.5 | 100% | None | 14 | 0.4 | 0.04 |
| 2 | 65/35 | 10.5 | 75% | 25% | 10.9 | 0.42 | 0.03 |
| 3 | 65/35 | 10.5 | 50% | 50% | 9.5 | 0.42 | 0.01 |
| 4 | 65/35 | 10.5 | 25% | 75% | 9.2 | 0.56 | 0.01 |
| 5 | 65/35 | 10.5 | 5% | 95% | 9.2 | 0.68 | 0.03 |

TABLE 3

| Example # | $SnO_2$:Binder Ratio | SnO2 Coverage $mg/ft^2$ | Gelatin | Polymer 5 | SER @ 20% RH |
|---|---|---|---|---|---|
| 6 | 65/35 | 10.5 | 100% | None | 14 |
| 7 | 65/35 | 10.5 | 75% | 25% | 14 |
| 8 | 65/35 | 10.5 | 50% | 50% | 13.2 |
| 9 | 65/35 | 10.5 | 25% | 75% | 10.7 |
| 10 | 65/35 | 10.5 | 5% | 95% | 9.2 |

The present invention provides an improved imaging element having antistatic layers containing colloidal conductive metal oxide containing particles and polyesterionomer binder or polyesterionomer-gelatin blend binder system. These layers exhibit superior conductivity and dynamic wettability at a given dry weight laydown and tin oxide to binder ratio when compared to those formulated using gelatin-only binder.

This invention permits the use of substantially lower tin oxide to binder ratios and lower dry weight coverages in the antistatic layer to achieve similar or lower surface resistivities than those disclosed in Prior Art and provides superior dynamic wettability characteristics of the photographic sup- 5. The imaging element of claim 1, wherein the binder further comprises gelatin, gelatin derivatives, maleic anhydride copolymers; cellulose compounds, synthetic hydrophilic polymers prepared from ethylenically unsaturated monomers, acrylonitrile, methacrylonitrile, vinyl acetate, vinyl ether, vinyl and vinylidene halide, olefins or polyurethanes.

6. The imaging element of claim 1, wherein the polyesterionomer comprises functionalized electron donors comprising the condensation residues of:
   (a) a diacid, and
   (b) an organic difunctional compound capable of undergoing condensation polymerization with said diacid, wherein at least one of said residues contains an arylamine electron donor group.

7. The imaging element of claim 1, wherein the polyesterionomer comprises functionalized electron donors comprising condensation residues of:

(a) a first diacid, (b) a second diacid containing an anionic iminodisulfonyl, carboxylic, phosphonate, phosphate, borate or sulfonium group, and (c) at least one organic difunctional compound capable of undergoing condensation polymerization with said first and second diacids;

wherein at least one of said first diacid and organic difunctional compound residues contains an arylamine electron donor group.

8. An imaging element comprising:

a support;

an image-forming layer superposed on the support;

an electrically-conductive layer superposed on the support; said electrically-conductive layer comprising an electrically-conductive particle having an average particle size less than 0.1 micrometer and a binder, said binder comprising at least 25 weight percent of a polyesterionomer containing an arylamine electron donating group and having the structure I or Ia

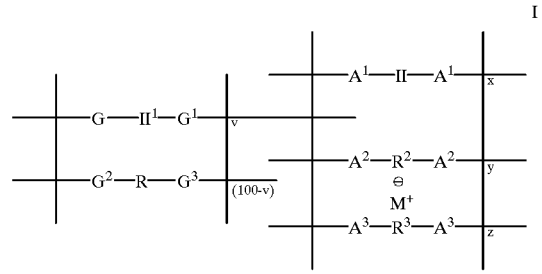

I

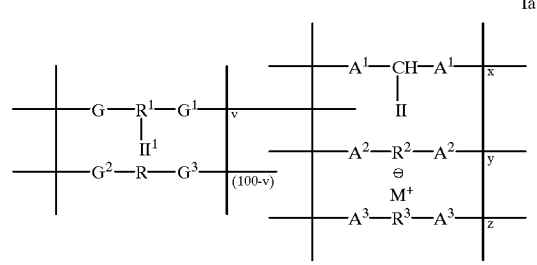

Ia wherein $\pi$ and $\pi^1$, which are the same or different, are organic groups containing an arylamine; $R^1$-$\pi^1$ together with G and $G^1$ represents an organic condensation residue of a difunctional compound capable of undergoing condensation with organic diacids; R together with $G^2$ and $G^3$ represents the organic condensation residue of at least one difunctional compound capable of undergoing condensation with organic diacids; G and $G^1$, which are the same or different, and $G^2$ and $G^3$, which are the same or different, represent —O— or —NH—; $A^1$, $A^2$ and $A^3$, which are the same or different, represent the residue of acid groups; $R^2$— is an organic group which contains an anionic iminodisulfonyl, carboxylic, phosphonate, phosphate, borate or sulfonium group; M+ is a cation; -$A^3$-$R^3$-$A^3$ represents an organic diacid condensation residue; x is 0 to 100 mole percent of the total diacid content; y is 5 to about 50 mole percent of the total diacid content, and z is 0 to 95 mole percent of the total diacid content; the sum of x, y and z is 100; v is 0 to 100 mole percent of the total difunctional compound content.

9. The imaging element of claim 8 wherein, $\pi$ and $\pi^1$ have the structure:

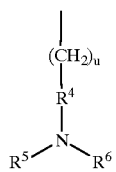

wherein u is an integer from 1 to 6, and $R^5$ and $R^6$ are the same or different and represent alkyl, cycloalkyl, aryl or aralkyl; $R^4$ represents alkylene, cycloalkylene, arylene or arylenealkylene, at least one of $R^4$, $R^5$ and $R^6$ comprises an aromatic group appended to the nitrogen atom; $R^3$ is an alkylene, arylene, arylenealkylene, cycloalkylene, heterocyclic groups or ethylenically unsaturated groups; and $A^1$, $A^2$ and $A^3$, are

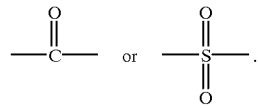

10. The imaging element of claim 9 wherein, $R^4$ is phenylene, $R^5$ and $R^6$ are each phenyl or tolyl, u is 1, v is 0 and $R^2$ is selected from the group consisting of:

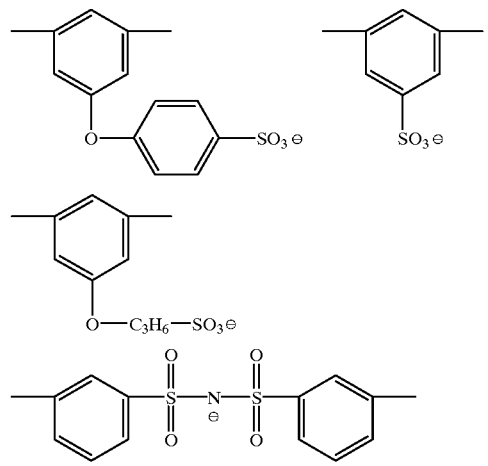

-continued

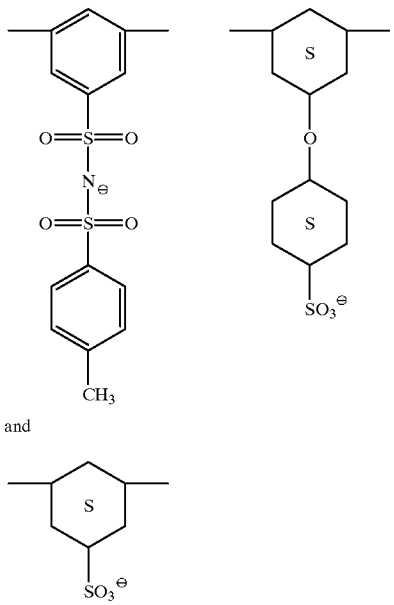

and

11. An imaging element comprising:
a support;
an image-forming layer superposed on the support;
an electrically-conductive layer superposed on the support;
said electrically-conductive layer comprising an electrically-conductive antimony-doped tin oxide particle having an average particle size less than 0.1 micrometer and a binder, said binder comprising at least 25 weight percent of a polyesterionomer containing an arylamine electron donating moiety.

12. The imaging element of claim 11, wherein the electrically-conductive antimony-doped tin oxide particles comprise a volume percent of from 20 to 80 of said electrically-conductive layer.

13. The imaging element of claim 11, wherein the electrically-conductive layer further comprises matting agents, surfactants, coating aids, charge control agents, polymer latices, viscosity modifiers, hardeners, particle dyes, antifoggants or lubricating agents.

14. The imaging element of claim 11, wherein the binder further comprises gelatin, gelatin derivatives, maleic anhydride copolymers; cellulose compounds, synthetic hydrophilic polymers prepared from ethylenically unsaturated monomers, acrylonitrile, methacrylonitrile, vinyl acetate, vinyl ether, vinyl and vinylidene halide, olefins or polyurethanes.

15. The imaging element of claim 11, wherein the polyesterionomer comprises functionalized electron donors comprising the condensation residues of:
(a) a diacid, and
(b) an organic difunctional compound capable of undergoing condensation polymerization with said diacid, wherein at least one of said residues contains an arylamine electron donor group.

16. The imaging element of claim 11, wherein the polyesterionomer comprises functionalized electron donors comprising condensation residues of:
(a) a first diacid,
(b) a second diacid containing an anionic iminodisulfonyl, carboxylic, phosphonate, phosphate, borate or sulfonium group, and (c) at least one organic difunctional compound capable of undergoing condensation polymerization with said first and second diacids;
wherein at least one of said first diacid and organic difunctional compound residues contains an arylamine electron donor group.

17. An imaging element comprising:
a support;
an image-forming layer superposed on the support;
an electrically-conductive layer superposed on the support; said electrically-conductive layer comprising an electrically-conductive antimony-doped tin oxide particle having an average particle size less than 0.1 micrometer and a binder, said binder comprising at least 25 weight percent of a polyesterionomer containing an arylamine electron donating group and having the structure I or Ia

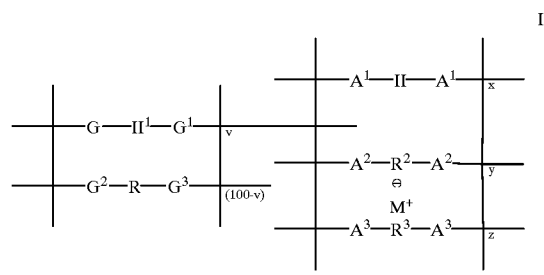

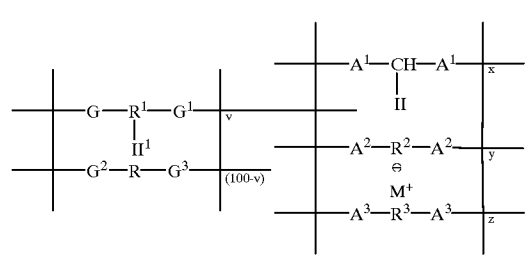

wherein $\pi$ and $\pi^1$, which are the same or different, are organic groups containing an arylamine; $R^1$-$\pi^1$ together with G and $G^1$ represents an organic condensation residue of a difunctional compound capable of undergoing condensation with organic diacids; R together with $G^2$ and $G^3$ represents the organic condensation residue of at least one difunctional compound capable of undergoing condensation with organic diacids; G and $G^1$, which are the same or different, and $G^2$ and $G^3$, which are the same or different, represent —O— or —NH—; $A^1$, $A^2$ and $A^3$, which are the same or different, represent the residue of acid groups; $R^2$— is an organic group which contains an anionic iminodisulfonyl, carboxylic, phosphonate, phosphate, borate or sulfonium group; M+ is a cation; -$A^3$-$R^3$-$A^3$ represents an organic diacid condensation residue; x is 0 to 100 mole percent of the total diacid content; y is 5 to about 50 mole percent of the total diacid content, and z is 0 to 95 mole percent of the total diacid content; the sum of x, y and z is 100; v is 0 to 100 mole percent of the total difunctional compound content.

18. The imaging element of claim 17 wherein, $\pi$ and $\pi^1$ have the structure:

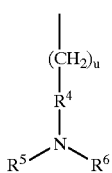

wherein u is an integer from 1 to 6, and $R^5$ and $R^6$ are the same or different and represent alkyl, cycloalkyl, aryl or aralkyl; $R^4$ represents alkylene, cycloalkylene, arylene or arylenealkylene, at least one of $R^4$, $R^5$ and $R^6$ comprises an aromatic group appended to the nitrogen atom; $R^3$ is an alkylene, arylene, arylenealkylene, cycloalkylene, heterocyclic groups or ethylenically unsaturated groups; and $A^1$, $A^2$ and $A^3$, are

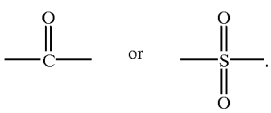

19. The imaging element of claim 18 wherein, $R^4$ is phenylene, $R^5$ and $R^6$ are each phenyl or tolyl, u is 1, v is 0 and $R^2$ is selected from the group consisting of:

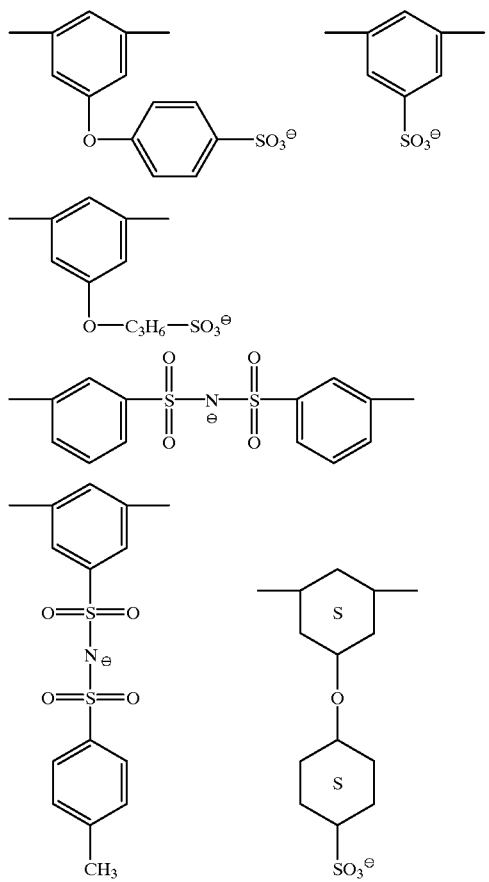

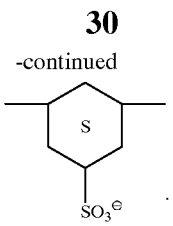

and

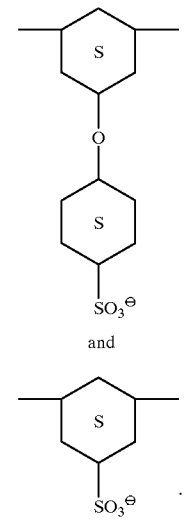

and

20. The imaging element of claim 2, wherein the metal containing particles comprise metal oxides, metal carbides, metal nitrides, metal silicides, or metal borides.

21. The imaging element of claim 2, wherein the metal containing particles comprise doped metal oxides, heteroatom donor-doped metal oxides, metal oxides containing oxygen deficiencies, doped tin-oxides.

22. The imaging element of claim 2, wherein the metal containing particles comprise antimony-doped tin oxide, niobium doped titanium dioxide, zinc antimonate, indium antimonate, tin-doped indium sesquioxide.

23. The imaging element of claim 2, wherein the metal containing particles are acicular.

24. The imaging element of claim 20, wherein the metal containing particles are acicular.

25. The imaging element of claim 21, wherein the metal containing particles are acicular.

26. The imaging element of claim 22, wherein the metal containing particles are acicular.

27. An imaging element comprising:

a support;

an image-forming layer superposed on the support;

an electrically-conductive layer superposed on the support; said electrically-conductive layer comprising an electrically-conductive particle having an average particle size less than 0.1 micrometer and a binder, said binder comprising at least 25 weight percent of a polyesterionomer having the structure I or Ia

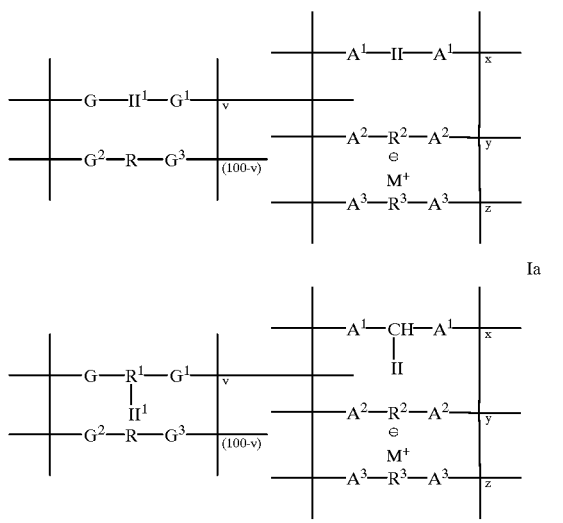

wherein π and π¹, which are the same or different, are organic groups containing an arylamine; $R^1$-$π^1$ together with G and $G^1$ represents an organic condensation residue of a difunctional compound capable of undergoing condensation with organic diacids; R together with $G^2$ and $G^3$ represents the organic condensation residue of at least one difunctional compound capable of undergoing condensation with organic diacids; G and $G^1$, which are the same or different, and $G^2$ and $G^3$, which are the same or different, represent —O— or —NH—; $A^1$, $A^2$ and $A^3$, which are the same or different, represent the residue of acid groups; $R^2$— is an organic group which contains an anionic iminodisulfonyl, carboxylic, phosphonate, phosphate, borate or sulfonium group; M+ is a cation; -$A^3$-$R^3$-$A^3$ represents an organic diacid condensation residue; x is 0 to 100 mole percent of the total diacid content; y is 5 to about 50 mole percent of the total diacid content, and z is 0 to 95 mole percent of the total diacid content; the sum of x, y and z is 100; v is 0 to 100 mole percent of the total difunctional compound content and v+x is at least 20.

28. An imaging element comprising:

a support;

an image-forming layer superposed on the support;

an electrically-conductive layer superposed on the support; said electrically-conductive layer comprising an electrically-conductive antimony-doped tin oxide particle having an average particle size less than 0.1 micrometer and a binder, said binder comprising at least 25 weight percent of a polyesterionomer having the structure I or Ia

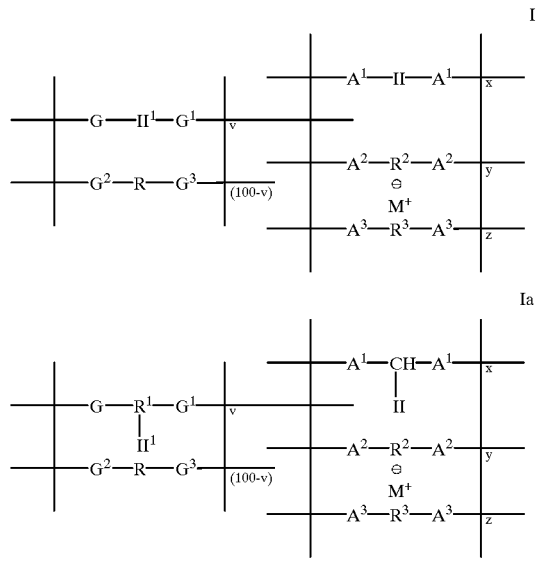

wherein π and π¹ which are the same or different, are organic groups containing an arylamine; $R^1$-$π^1$ together with G and $G^1$ represents an organic condensation residue of a difunctional compound capable of undergoing condensation with organic diacids; R together with $G^2$ and $G^3$ represents the organic condensation residue of at least one difunctional compound capable of undergoing condensation with organic diacids; G and $G^1$, which are the same or different, and $G^2$ and $G^3$, which are the same or different, represent —O— or —NH—; $A^1$, $A^2$ and $A^3$, which are the same or different, represent the residue of acid groups; $R^2$— is an organic group which contains an anionic iminodisulfonyl, carboxylic, phosphonate, phosphate, borate or sulfonium group; M+ is a cation; -$A^3$-$R^3$-$A^3$ represents an organic diacid condensation residue; x is 0 to 100 mole percent of the total diacid content; y is 5 to about 50 mole percent of the total diacid content, and z is 0 to 95 mole percent of the total diacid content; the sum of x, y and z is 100; v is 0 to 100 mole percent of the total difunctional compound content and v+x is at least 20.

* * * * *